Figure 10:
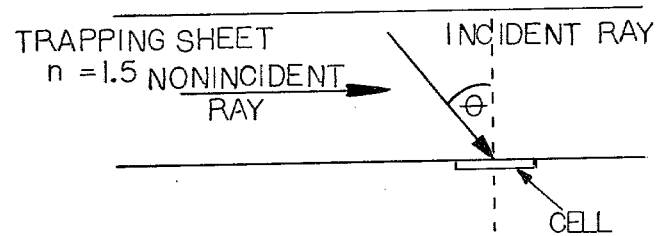

United States Patent [19]

Boling

[11] 4,190,465
[45] Feb. 26, 1980

[54] LUMINESCENT SOLAR COLLECTOR STRUCTURE

[75] Inventor: Norman L. Boling, Toledo, Ohio

[73] Assignee: Owens-Illinois, Inc., Toledo, Ohio

[21] Appl. No.: 959,964

[22] Filed: Nov. 13, 1978

[51] Int. Cl.$^2$ ............................................. H01L 31/04
[52] U.S. Cl. ........................ 136/89 FC; 136/89 CA; 136/89 CL; 250/227
[58] Field of Search ........ 136/89 FC, 89 CL, 89 CA; 250/227

[56] References Cited

U.S. PATENT DOCUMENTS 4,144,097  3/1979  Chambers et al. .............. 136/89 PC
4,149,902  4/1979  Mauer et al. ..................... 136/89 PC Primary Examiner—Aaron Weisstuch
Attorney, Agent, or Firm—Charles S. Lynch; M. E. Click; D. H. Wilson

[57] ABSTRACT

Disclosed is a luminescent solar collector comprising a relatively thick layer with a photocell coupled to a face surface thereof and at least one thin luminescent layer optically coupled to said thick layer, said thick layer having an index of refraction at least 0.04 more than each of said luminescent layers and being at least 10 times as thick as the sum of all other layers of said collector.

12 Claims, 10 Drawing Figures

LUMINESCENT SOLAR COLLECTOR STRUCTURE

This invention concerns the art of exposing semiconductors to sunlight to convert at least a part thereof to electrical energy. Such means for converting electromagnetic energy to electricity are known as photovoltaic cells or photocells, and common examples of such photocells are silicon or gallium arsenide semiconductors having P-N junctions. Commonly, an electrical lead is connected on either side of the semiconductor across the P-N junction.

Semiconductor photocells are very expensive; in consequence, it has been the practice to gather and concentrate the sunlight reaching a given semiconductor photocell so that such extremely large areas of semiconductor material need not be employed as would be necessary without such a gathering system. The common gathering systems in the past were optical systems, wherein lens systems concentrated the light and focused same on a given photocell.

However, such a lens system was and is relatively expensive and is not useful in diffuse light on a cloudy day. More recently, however, there has been conceived a different type of collector and concentrator of radiation to be impinged on a semiconductor photocell. For instance, Weber and Lambe in Applied Optics, Vol. 15, pages 2299–2300, October 1976, disclose a system whereby a large area sheet of material, such as a rigid plastic or a glass doped with a luminescent material is exposed to solar radiation. The luminescent medium ideally has a strong absorption for the sun's rays, especially in the visible where the solar spectrum peaks, and it emits electromagnetic radiation of a longer wavelength suitable for activating the semiconductor photocell. A large portion of the light emitted from the luminescent species is in effect trapped in the collector with essentially total internal reflection until the light reaches the area where a photocell, such as a silicon photocell, is optically coupled to a small area, for instance an edge, of the collector. In this way, the light from the sun is not only converted to more suitable wavelengths for activation of the photocell, but is concentrated since the light received by the large area of the collector escapes only in the small area where the photocell is optically connected to the collector.

Another article, by Levitt and Weber, appearing in Applied Optics, Vol. 16, No. 10, pages 2684–2689, October 1977. should be read with the article first mentioned.

Other publications aiding in the understanding of the luminescent solar collectors include Goetzberger, Applied Physics, 14, 123–139, 1977, U.S. Pat. No. 4,110,123 issued Aug. 29, 1978, claiming priority in part based on German patent application Nos. 2620115 published Nov. 10, 1977, filed May 6, 1976, and 2628917 published Jan. 12, 1978, filed June 24, 1976, and, referred to in the former patent application, German patent application No. 2554226, published June 8, 1977, which is of some peripheral interest.

Also, numerous patents deal with the conversion of solar energy to different wavelengths by means of luminescent or fluorescent layers and impinging emitted light on a photocell; examples are U.S. Pat. Nos. 3,426,212, 3,484,606 and 3,912,931, which patents, however, do not have the concept of concentrating the light from a large area and collecting it over a much smaller area by optical coupling to a relatively small area semiconductor photocell. In U.S. Pat. No. 3,912,931 benzene and other aromatic hydrocarbons are said to be "fixed" in layers of a silicone resin superimposed on the photocell.

The present invention is an improvement in luminescent solar collectors and concentrators which are in a very general way of the type disclosed in the Goetzberger et al. publication, U.S. Pat. No. 4,110,123 and German application No. 2620115, in the Weber and Lambe paper and in the Levitt and Weber paper, and more particularly of a type having two or more light conducting layers; see the structure disclosed in Research Disclosure, October 1977 issue, pages 43–44, disclosed by Paul B. Mauer et al., published by Industrial Opportunities, Ltd., Homewell, Havant, Hampshire, England, also see the Rapp and Boling paper cited infra.

As used herein and in the claims, the term "luminescent solar collector" means a light conducting medium having two opposing, usually parallel, surfaces of extended area relative to the other surfaces of said medium (such as edges), which medium contains a luminescent species that absorbs solar radiation of one wavelength and emits at a longer wavelength. Of course, in accordance with well understood optical principles (Snell's law), that portion of the emitted luminescent radiation generated at larger angles than the critical angle relative to a line perpendicular to a given extended surface of the medium is trapped within the medium by the process of total internal reflection. Such portion for a flat sheet having an index of refraction of 1.5 is about 75 percent, as is well-known. As is well-known, a luminescent solar collector, because of total internal reflection, collects and concentrates the trapped luminescent radiation and can deliver it to a relative small area of the collector, such as a small area or areas of the collector face or one or more or all of the edges of the luminescent radiation collection medium, where it can be optically coupled to a desired means, such as to a photovoltaic cell. By "optically coupled" as used herein is meant that there is a low or minimum reflection at the interface of the photocell and the collection medium or trapping sheet.

The shape of the faces can be rectangular, triangular, hexagonal or any other shape, regular or irregular.

It is emphasized that the foregoing definition of a "luminescent solar collector" is broad, that the "light conducting medium" of said definition can be one layer or two or more layers, each being of a homogeneous, continuous, light conducting material such as plastic or glass, each layer being optically coupled to the next, to make the collector or trapping medium. One or more, or all, of the layers can contain a luminescent species as defined. When a luminescent species is present in more than one such layer the absorption band of one can advantageously overlap the emission band of the other species, thus coupling or cascading the emission of one luminescent species to the absorption of another. Or two or more such "coupled" luminescent species can be present in a given layer of the collection medium so that, again, the emission spectrum of one overlaps the absorption spectrum of the other in a cascade arrangement, as in Swartz et al. in Optics Letters, Vol. 1, No. 2, August 1977, pp. 73–75, and in Science News, Vol. 112, No. 20, Nov. 12, 1977, pp 313–314, or as on page 130 of the cited Goetzberger et al. publication.

The concept and structure of a luminescent solar collector coupled to at least one photovoltaic cell, of the general type described hereinbefore, but having a light conducting medium of two or more homogeneous, continuous layers physically and optically coupled to one another, wherein said light conducting medium is optically and physically coupled to a photocell, is described in a paper entitled "Luminescent Solar Concentrator" by C. F. Rapp and N. L. Boling presented before the XIII IEEE Photovoltaic Specialists Conference, June 5-8, 1978 in Washington, D. C. at the Americana Hotel, published Sept. 1, 1978 on pp. 690–93 of the "Conference Record, Thirteenth Photovoltaic Specialists Conference 1978", Institute of Electrical and Electronic Engineers, New York, N. Y. See also Optical Spectra, April 1978, under heading "Industry Briefs." In one embodiment this structure or the similar one disclosed by Mauer et al., noted above is modified in a novel manner in the present invention. One of the layers is relatively thin and is an organic plastic containing a luminescent species such as an organic fluorescent dye.

In the main embodiment of the apparatus of the present invention, the edge surfaces of the luminescent solar collector have a highly reflective coating or mirror to prevent escape of trapped luminescent radiation at such edges unless coupled to a photovoltaic cell, as will be understood. However, one or more edges can be used for other purposes such as (1) a display of concentrated light or to activate liquid crystal displays as in the extended surface displays of German OLS No. 2554226 dated June 8, 1977 or (2) coupled to other utilization such as means for absorbing luminescent rays and converting same to heat. Normally, however, a structure according to the invention will have a reflective coating on all edge surfaces.

In the prior art cited herein, most of the luminescent solar collectors used to activate solar cells have a photovoltaic solar cell optically coupled to an edge surface thereof. However, in German patent application No. 2620115 published Nov. 10, 1977, the inventors recognized that there is a problem in efficiently coupling a photocell to the extended face of a luminescent solar collector, as opposed to an edge surface.

The basic problem arises from the shallow angles at which many of the rays strike the luminescent solar collector-photocell interface, as exemplified in the sketch of FIG. 10. In this illustration, with a trapping sheet refractive index of 1.5, all trapped luminescent rays (emanating internally in the trapping sheet) that strike the cell do so at an angle $\theta \leq 41.8°$, the critical angle for n=1.5. Some rays do not strike the cell at all in the first pass, perhaps in several passes, as indicated in the drawing by the "nonincident" ray. The number of these nonincident rays is a function of the ratio of the cell width to the trapping sheet thickness. Obviously, a cell on a thin sheet will intercept more of the light passing the cell.

Consider the distribution of the ray direction in the sheet. The fraction F of the trapped rays moving in a direction between $\theta = 90°$ and $\theta$ is given by $F = \cos \theta / \cos \theta_C$, where $\theta_C$ is the critical angle. Thus for n=1.5, 67% of the trapped energy that is incident on the cell at all strikes it at angles between $\theta = 60°$ and $\theta = 90°$.

AR (antireflection) coatings for efficiently coupling the light from the trapping sheet into the cell can be designed so that little reflection occurs for angles less than approximately 60°. However, for progressively greater angles, AR coatings become less effective, until at near 90° no AR effect at all is achieved. Therefore, one solution is to design the luminescent solar collector in such a way that most trapped rays are incident on the cell-collector interface at $\theta \leq 60°$ angles.

Figure 2:
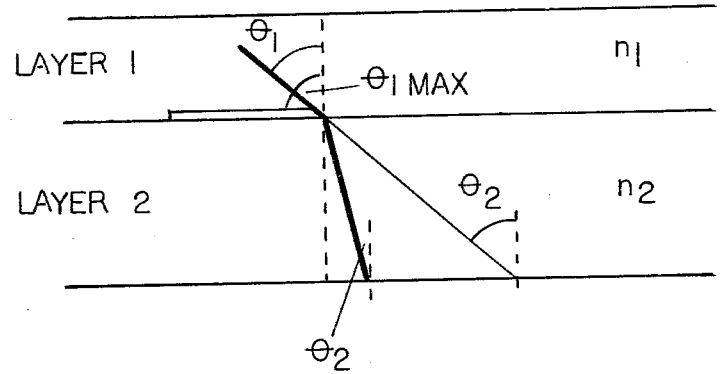
Figure 4:
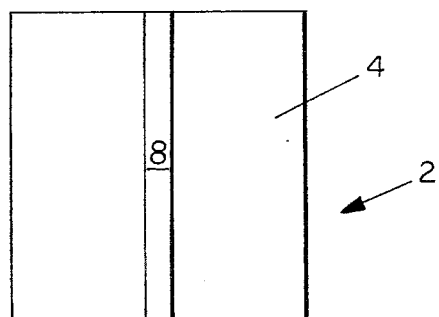

The proposed solution to this problem in the German patent application is illustrated in FIG. 2 therein (and as well as in FIG. 4). In FIG. 2, notches which are mirrored are cut in the collector plate opposite the location of the photocell. Although the photocell in FIG. 2 is not actually shown as being coupled or bonded to the collector plate, if the cell were optically coupled to the collector plate, the mirrored notches would work by converting a number of the shallow angled rays to steep angle rays so that they would hit the solar cell instead of passing over it. However, there are several disadvantages to this scheme. Unless the notches are very deep or the trapping sheet very thin relative to the notched area, a large fraction of the light can escape past the cell area and past the notch area. Thus, it is obvious from the German patent application drawing that, given the relative dimensions indicated in the drawing, only a small fraction of the originally shallow angle luminescence will ever strike the cell. Making the notches deep of course weakens the structure, and making the cell wide decreases the concentration ratio of the area of the collector-concentrator to the area of the expensive photocell material.

A further disadvantage of the structure of the German patent application lies in the fabrication and silvering of the notches. If the notches are not sharp at the troughs, a loss of efficiency in converting the ray angle results. Also, given even the best silvering or mirroring, a five to ten percent reflection loss occurs at the notches.

It is an object of the present invention to provide a luminescent solar collector structure designed for more efficient coupling to a photovoltaic cell or cells located on a face surface of extended area thereof.

It is another object to provide a luminescent solar collector with a photovoltaic cell coupled to a small portion of an extended face area thereof, wherein luminescent rays created in said collector will on the average strike the coupled area at a relatively steeper angle in order to minimize reflection losses and insure relatively efficient coupling.

Other objects, as well as aspects and advantages, of the invention will become apparent from the present specification, the drawings and the claims.

The foregoing objects and others are satisfied in accordance with one aspect of the present invention in which there is provided a luminescent solar collector having at least two light conducting layers, each layer being optically and physically coupled to the next adjacent layer, said luminescent solar collector having a relatively thick light conducting layer to which at least one photocell is optically and physically coupled on a minor portion of one of the extended surfaces thereof, said relatively thick layer having the highest refractive index of any layer in said collector, said photocell-coupled layer optionally containing a luminescent species which if present has an emission that is absorbed by and activates another luminescent species in another of the layers of said collector, each of the layers of said collector other than the photocell-coupled layer having an index of refraction at least 0.04 less than said relatively thick layer, said relatively thick layer being at least ten

(10) times as thick as the sum of all other layers of said luminescent solar collector.

As will be explained later, the provision of the highest index of refraction in the cell-coupled layer bends the luminescent rays that are trapped toward a steeper angle as they strike the face of the photocell, making for more efficient coupling thereto. This feature also decreases the distance between the points at which a given ray will strike the face of the cell-coupled thick layer, and this effect is greatly enhanced by the relative thicknesses specified as will be understood from the simple geometry involved. Because of this latter effect the probability that a given cell of a given width will be struck by a given luminescent ray is greatly increased than if the luminescent layer and the cell-coupled layer had the same refractive index and the same thickness.

In its broadest aspect the present invention comprises a luminescent solar collector comprising a relatively thick layer with at least one photocell coupled to a minor portion of an extended face surface thereof and at least one thin luminescent layer optically coupled to said thick layer, said thick layer having an index of refraction at least 0.04 more than each of said luminescent layers and being at least 10 times as thick as the sum of all other layers of said collector. In this aspect the arrangement is such that the luminescent rays emitted from the thin luminescent layer strikes a photocell at steeper angles than if the indices of refraction of the two layers were the same, and more often than if the two layers were more nearly equal in thickness.

Figure 1:
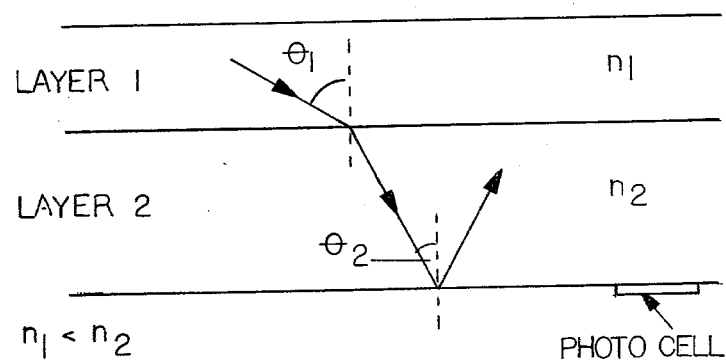
Figure 3:
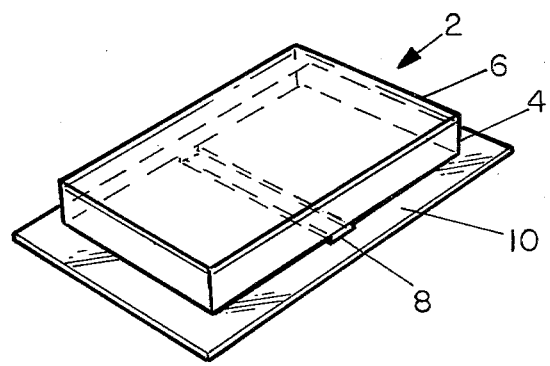
Figure 5:
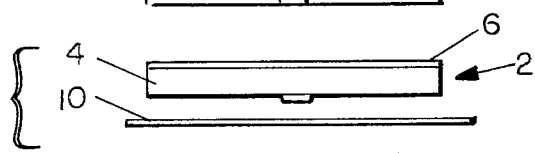
Figure 6:
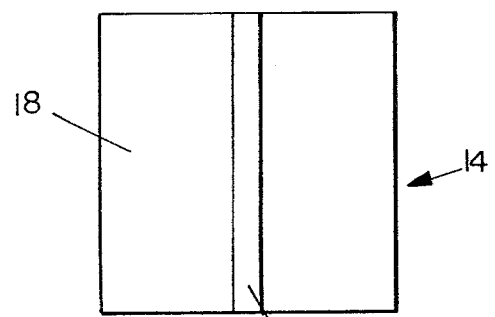
Figure 7:
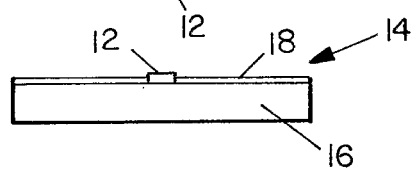
Figure 8:
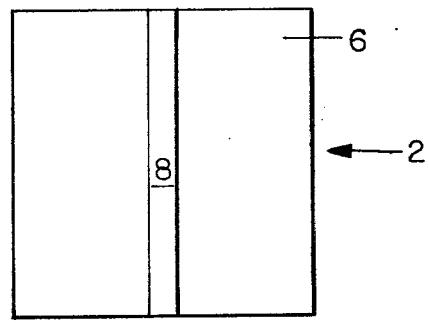
Figure 9:
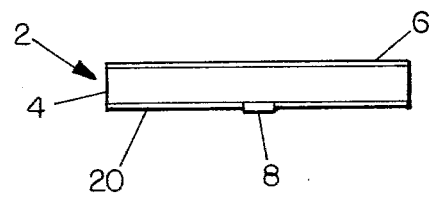

The invention will be better understood in connection with the following discussion of the drawings, of which FIGS. 1 and 2 are sketches illustrating principles of the invention, FIG. 3 is a perspective view of one embodiment of the invention, FIG. 4 is a bottom view of the structure of FIG. 3 but not showing the bottom mirror thereof, FIG. 5 is a front view of FIG. 3, FIGS. 6 and 7 are, respectively, the top and front views of another embodiment of the structure of the invention, FIGS. 8 and 9 are, respectively, the bottom and front views of another embodiment of the invention.

FIG. 10 is a sketch illustrating the prior art problem.

The steepening of luminescent rays incident on a photocell optically coupled to a trapping sheet is explained as follows, referring to FIG. 1, where layer 1 contains a luminescent species:

Luminescent medium, layer 1, has refractive index $n_1$. Layer 2 of the composite trapping sheet, onto which photocells are placed in this embodiment, has index $n_2$. Snell's law relates $\theta_1$ and $\theta_2$:

$$\sin \theta_1 / \sin \theta_2 = n_2/n_1$$

or $$\theta_2 = \sin^{-1}(n_1 \sin \theta_1 / n_2) \quad \text{Equation (1)}$$

Further, the critical angle, $\theta_c$, the angle marking the separation of luminescent rays originating in a planar sheet into rays that escape said sheet and those totally internally reflected, when air or a vacuum with $n=1$ is the surrounding medium, is calculated as follows:

$$\theta_c = \sin^{-1} \cdot 1/n_s$$

where $n_s$ is the index of the sheet.

Note that if $\theta_1$ in FIG. 1 is the critical angle, $\theta_{1c}$, (vs. air or a vacuum) for medium 1, $\theta_2$ is the critical angle, $\theta_{2c}$, for medium 2. Thus when $\theta_1 = \theta_{1c}$ $$\theta_2 = \sin^{-1}(n_1/n_2 \cdot 1/n_1) = \sin^{-1} 1/n_2 = \theta_{2c} \quad \text{Equation (2)}$$

Therefore, a ray trapped in medium 1 will also be trapped in medium 2.

Now a certain fraction of the light created in medium 1 will be trapped by total internal reflection, about 75% if $n_1 = 1.5$. Of this trapped fraction, a fraction $F = \cos \theta_{1c}$ will be emitted between any given angle $\theta$, greater than $\theta_c$ and $\theta_1 = 90°$. Thus about 67% of the light totally internally reflected in medium 1 will be propagating in medium 1 at an angle $\theta$, between 90° and 60°, making it difficult to couple into a photocell if n were the same for layer 1 and layer 2. (The greater the angle $\theta_2$ the more difficult it is to couple into the cell, until for angles near $\theta_2 = 90°$ it becomes practically impossible.)

By making the luminescent film (medium 1) index appreciably less than the substrate (medium 2) index the situation is much improved. This obtains for two reasons: (1) the shallow (large $\theta_1$) rays in medium 1 are steeped as they refract into medium 2, thereby leading to a steeper angle of incidence on the cell; (2) the steepened angle of the rays in medium 2 leads to a greater number of times that a ray can be incident on the cell for a given cell width.

The improvement of the first part can be indicated quantitatively. We ask the question: "what fraction $F_1$ of the total light trapped in the luminescent solar collector lies between $\theta_{2max}$ and $\theta_2$, where $\theta_2$ is arbitrary?" This question and its answer are made clearer by reference to FIG. 2: It is obvious that the ray determining $\theta_{2max}$ is the $\theta_1 = 90°$ ray in medium 1. By setting $\theta_1 = 90°$ in Equation 1 we obtain $$\theta_{2max} = \sin^{-1} \cdot (n_1/n_2) \quad \text{Equation (3)}$$

Thus rays between $\theta_1 = 90°$ and $\theta_1 = \theta_1$ will fall between $\theta_{2max}$ and $\theta_2$ in medium 2. Since the fraction $F_1$ of rays between $\theta_1 = 90°$ and $\theta_1 = \theta_1$ is given by $$F_1 = \cos \theta_1 / \cos \theta_{1c} \quad \text{Equation (4)}$$

and since from eq. (1)

$$\theta_1 = \sin^{-1}((n_2/n_1) \sin \theta_2) \quad \text{Equation (5)}$$

it follows that $$F_1 = \cos \sin^{-1}((n_2/n_1) \sin \theta_2) \cos \theta_{1c} = (n_1^2 - n_2^2 \cdot \sin^2 \theta_2/n_1^2 - 1)^{\frac{1}{2}} \quad \text{Equation (6)}$$

Equation 6 then gives us the fraction of the trapped rays lying between $\theta_{2max}$ and arbitrary $\theta_2$ in medium 2, and Equation 3 gives $\theta_{2max}$.

Some numbers are given in the table below, where $\theta_2 = 60°$ has been chosen when $\theta_{2max}$ is greater than 60°. Note that for $n_1 = 1.50$ and $n_2 = 1.73$, $\theta_{2max} = 60°$.

| $n_1$ | $n_2$ | $\theta_2$ | $\theta_{2max}$ | $F_1$ |
|---|---|---|---|---|
| 1.5 | 1.5 | 60° | 90° | 0.67 |
| 1.48 | 1.50 | 60° | 81° | 0.66 |
| 1.50 | 1.55 | 60° | 75° | 0.60 |
| 1.45 | 1.55 | 60° | 69° | 0.54 |
| 1.50 | 1.73 | 60° | 60° | 0 |

-continued

| $n_1$ | $n_2$ | $\theta_2$ | $\theta_{2max}$ | $F_1$ |
|---|---|---|---|---|
| 1.50 | 2 | 49° | 49° | 0 |

In the table for $\theta_2 = 60°$ (or 49° in one case), when $n_1$ and $n_2$ are as shown, then $\theta_2$ maximum and $F_1$ are as shown. Thus, for example, when the film has an index $n_1 = 1.50$ and the substrate an index $n_2 = 1.55$, the shallowest ray incident on the cell is at $\theta_{2max} = 75°$, and the fraction $F_1$ of trapped rays incident on the cell at angles greater than $\theta_2 = 60°$ is 0.60. This contrasts with $\theta_{2max} = 90°$ and $F_1 = 0.67$ when $n_2 = n_1$. For these numbers, the enhancement in coupling is due to the absence of rays approaching $\theta_2$ of 90° in layer 2.

It can be seen that even small differences in the indices of the films and substrate can help appreciably, especially in that the rays near $\theta_1 = 90°$ are appreciably steepened when they enter the thick layer. And if the differences in indices can be made great enough, no shallow ($\theta_2 > 60°$) angle rays will appear at all in medium 2.

Specific illustrations of arrangements of the present invention will be described, starting with the embodiment of FIGS. 3-5. Luminescent solar collector 2 has a relatively thick light conducting medium 4 optically coupled to thin light conducting, luminescent layer 6, and also physically and optically coupled to a photovoltaic cell 8 on the opposite side. Optional mirror 10 is to reflect back any escaping light that would activate luminescent species in the solar collector.

Incidentally, such a mirror on the side of the luminescent solar collector opposite the side facing the sun is often advantageous in the various embodiments of the invention, but is not essential to the invention. Thus, if the concentration of the luminescent species in the various layer or layers containing luminescent species is not high enough to absorb all of the sun's rays of a wavelength that activates that luminescent species, the mirror is useful to provide a second pass. Such a mirror can also sometimes be used to reflect that portion of the luminescent emission not trapped back into the collector for absorption by another luminescent species in another layer in order to activate that luminescent species. Layer 4 is at least 10 times the thickness of layer 6.

Light strikes the top layer 2, which has a lower index of refraction than layer 4, as specified in this application. The sunlight activates the luminescent species and the longer wavelength emitted radiation is bent on passing from layer 6 to layer 4, toward the normal as previously explained.

It is pointed out that the structure of FIGS. 3-5, without the mirror, can be turned upside down with layer 4 facing the sun instead of layer 6. Optionally, of course, a mirror can be provided below the luminescent solar collector so positioned. In any event, the operation of the luminescent solar collector and the bending of the rays is still essentially the same as if facing the other direction because the luminescent radiation when it is activated by solar energy is still bent in the desired direction when entering layer 4 from layer 6.

In another embodiment according to FIGS. 3-5 thick light conducting layer 4 can also contain a homogeneously dispersed luminescent species, but in such event the solar energy activates this luminescent species and the emitted luminescent radiation is absorbed by and activates the luminescent species in layer 6.

The embodiment of FIGS. 6 and 7 is similar, except that the solar cell 12 of luminescent solar collector 14 is optically and physically coupled to the same side of light conducting layer 16 as is thin luminescent, light conducting layer 18, which is also physically and optically coupled to layer 16. Layer 18 has a lower index of refraction than layer 16 in accordance with the invention as previously noted. The operation is the same as described with respect to FIGS. 3-5 except that the luminescent radiation is coupled out at photocell 12 on the same side as the luminescent layer. Layer 16 is at least 10 times as thick as layer 18. Again, if thick layer 16 contains a luminescent species, as it can, it will be of the same relationship vis-a-vis the luminescent species of thin layer 18 as was discussed with respect to thick layer 4 relative to thin layer 6 in FIGS. 3-5.

Again, the structure of FIGS. 6 and 7 can also be turned over so that 16 faces the sun and the operation is essentially the same. Moreover, with respect to the embodiment of FIGS. 3-5 as well as the embodiment of FIGS. 6-7, when the thick layer faces the sun and contains a species that absorbs ultraviolet radiation, it is an advantage that the absorption of the ultraviolet radiation serves to protect the thin layer which is usually of an organic plastic and the luminescent species contained therein, which is usually organic such as a fluorescent dye. Many such dyes and plastics are degraded on exposure to ultraviolet light.

The embodiment of FIGS. 8-9 is the same as the embodiment of FIGS. 3-5, except that a luminescent layer 20 has been added to the same side as photocell 8. The index of refraction of luminescent layer 20 is at least 0.04 lower than the index of refraction of light conducting layer 4, as is of course the index of refraction of luminescent layer 6. The luminescent species in layers 6 and 20 can be the same or different than each other and can have the same or different absorption and emission spectra. In the case where the thick layer 4 contains a luminescent species, its luminescent output emission is absorbed by and activates the luminescent species in one or both of the layers 6 and 20. This ensures that all trapped radiation bouncing back and forth in the solar collector 2 will be bent toward the normal before striking photocell 8.

In all of the foregoing FIGS. 3-9, all of the edge surfaces of the respective luminescent solar collectors contain a highly reflective coating such as an alumina or silver mirror coating.

Of course, while not shown in the drawings there may be according to the invention several such thin layers one on top of the other, each containing a luminescent species, usually different. Thus, each of thin layers 6, 18 and 20 of FIGS. 3-9 can be multiple thin layers each optically and physically coupled to the next adjacent layer.

In a specific example according to FIGS. 3-5, plate or layer 4 is an iron-free glass, 60 mm. square and 3 mm. thick, having the composition

| Component | Wt. Percent |
|---|---|
| $SiO_2$ | 60 |
| $Al_2O_3$ | 2.5 |
| $Li_2O$ | 27.5 |
| CaO | 10 | and an index of refraction of 1.56. Thin layer 6 is made by dissolving poly(methyl methacrylate) (a commercial product of du Pont tradenamed Elvacite 2008) in methyl ethyl ketone to make a 30 weight percent solution of the polymer in the mixture. This solution is spray coated onto the top of the layer or plate 4. Before spraying, the polymer solution has added to it 0.15 grams of Coumarin 153 fluorescent dye for each 50 grams of the polymer. Enough coats are sprayed to make a coating or film 2 mils thick, having an index of refraction of 1.49, on the plate after drying. A very thin coating of the same concentration polymer solution without the dye is painted on the surface of a silicon photovoltaic cell having a P–N junction and the coated side cemented to the bottom of the glass plate across the middle thereof to make optical and physical contact between the cell and the glass plate.

In another specific example just like the above example, except that Coumarin 6 is in the lower layer 20 (having a refractive index of 1.50) according to FIGS. 8–9 in the same polymer, the Coumarin 6 emission is absorbed by and activates the Coumarin 153 in layer 6.

In both examples the luminescent rays entering layer 4 from luminescent layer 6 are steepened and thus hit cell 8 at appreciably steeper average angles than if all layers of the luminescent solar collector had the same refraction index.

As exemplary luminescent materials or species useful in the present invention there can be mentioned by way of example fluorescent chelates and fluorescent dyes. Numerous specific dyes are known and available that absorb in different portions of the solar spectrum. These form no part of the present invention. It should also be mentioned that in the thin film luminescent layer 6, it is very advantageous and preferred that a given luminescent species used has absorption and emission spectra that overlap each other as little as possible, and they preferably do not measurably overlap. Dyes having this characteristic include, for instance, Coumarin 153, Coumarin 6 and Coumarin 151. Coumarin 153 is 1.2.4.5.3H.6H.10H.Tetrahydro-8-trifluoromethyl(1)benzopyrano(9.9a.1-gh)quinolizin-10-one, Coumarin 6 is 3-(2-Benzothiazolyl)-7-N.N-diethylamino-coumarin, and Coumarin 151 is 7-Amino-4-trifluoromethyl-coumarin.

As will be evident to those skilled in the art, various modifications of this invention can be made or followed in the light of the foregoing disclosure and discussion without departing from the spirit and scope of the disclosure or from the scope of the claims.

I claim:

1. A luminescent solar collector having at least two light conducting layers, each layer being physically and optically coupled to the next adjacent layer, one of said at least two layers (1) being relatively thick compared to each of the other of the other said layers and (2) having at least one photocell optically and physically coupled on a minor portion of one of the extended face surfaces thereof, and the other of said at least two layers being luminescent, said relatively thick layer having the highest refractive index of any layer in said collector, said photocell-coupled layer optionally containing a luminescent species which if present has an emission that is absorbed by and activates another luminescent species in another of the layers of said collector, each of the layers of said collector other than the photocell-coupled layer having an index of refraction at least 0.04 less than said relatively thick layer, said relatively thick layer being at least ten (10) times as thick as the sum of all other layers of said luminescent solar collector.

2. A luminescent solar collector of claim 1 wherein the said relatively thick layer contains no luminescent species.

3. A luminescent solar collector of claim 2 where said photocell is coupled to one side of said thick layer and a relatively thin luminescent layer is coupled to the opposite side thereof.

4. A luminescent solar collector of claim 2 where said photocell is coupled to one side of said thick layer and a relatively thin luminescent layer is coupled to the same side thereof.

5. A luminescent solar collector of claim 2 wherein each extended face surface of said luminescent solar collector is physically and optically coupled to a thin luminescent layer.

6. A luminescent solar collector of claim 1 where said photocell is coupled to one side of said thick layer and a relatively thin luminescent layer is coupled to the opposite side thereof.

7. A luminescent solar collector of claim 1 where said photocell is coupled to one side of said thick layer and a relatively thin luminescent layer is coupled to the same side thereof.

8. A luminescent solar collector of claim 1 wherein the said relatively thick layer contains at least one luminescent species.

9. A luminescent solar collector of claim 8 where said photocell is coupled to one side of said thick layer and a relatively thin luminescent layer is coupled to the opposite side thereof.

10. A luminescent solar collector of claim 8 where said photocell is coupled to one side of said thick layer and a relatively thin luminescent layer is coupled to the same side thereof.

11. A luminescent solar collector of claim 8 wherein each extended face surface of said luminescent solar collector is physically and optically coupled to a thin luminescent layer.

12. A luminescent solar collector comprising a relatively thick layer with at least one photocell coupled to a minor portion of an extended face surface thereof and at least one relatively thin luminescent layer optically coupled to an extended face surface of said thick layer, said thick layer having an index of refraction at least 0.04 more than each of said luminescent layers and being at least 10 times as thick as the sum of all other layers of said collector.

* * * * *